US005487967A

United States Patent [19]
Hutton et al.

[11] Patent Number: 5,487,967
[45] Date of Patent: Jan. 30, 1996

[54] SURFACE-IMAGING TECHNIQUE FOR LITHOGRAPHIC PROCESSES FOR DEVICE FABRICATION

[75] Inventors: Richard S. Hutton, Summit; Gary N. Taylor, Bridgewater, both of N.J.; David R. Wheeler, Albuquerque, N.M.

[73] Assignee: AT&T Corp., Murray Hill, N.J.

[21] Appl. No.: 390,733

[22] Filed: Feb. 17, 1995

Related U.S. Application Data

[63] Continuation-in-part of Ser. No. 68,485, May 28, 1993.
[51] Int. Cl.$^6$ ........................................ G03F 7/38
[52] U.S. Cl. .................. 430/322; 430/325; 430/324; 430/967; 216/49; 216/47; 156/628.1
[58] Field of Search ..................... 430/325, 324, 430/967, 322; 156/628.1; 216/49, 47

[56] References Cited

U.S. PATENT DOCUMENTS

| | | | |
|---|---|---|---|
| 4,551,418 | 2/1985 | Hult et al. | 430/325 |
| 4,552,833 | 11/1985 | Ito et al. | 430/325 |
| 4,657,845 | 1/1986 | Frechet et al. | 430/326 |
| 4,737,425 | 4/1988 | Lin et al. | 430/312 X |
| 4,957,588 | 11/1989 | Koshiba et al. | 156/628 |
| 5,085,729 | 9/1990 | Garza et al. | 156/628 |
| 5,094,936 | 6/1990 | Misium et al. | 430/325 |
| 5,116,715 | 3/1991 | Roland et al. | 430/191 |
| 5,139,925 | 8/1992 | Hartney | 430/326 |
| 5,320,934 | 6/1994 | Misium et al. | 430/324 X |
| 5,366,852 | 11/1994 | Pavelchek et al. | 430/324 X |
| 5,384,220 | 1/1995 | Sezi et al. | 430/324 X |

OTHER PUBLICATIONS

*Solid State Technology*, "DESIRE: A New Route to Submicron Optical Lithography", by F. Coopmans et al., Jun. 1987, pp. 93–99.

*SPIE Advances in Resist Technology and Processing*, "Manufacturability Issues of the DESIRE Process", by C. M. Garza et al., VII, vol. 1086, (1989), pp. 229–237.

*SPIE Advances in Resist Technology and Processing*, "Silylation of poly(t–BOC) styrene resists: Performance and Mechanisms", by C. A. Spence et al., vol. 1262, (1990) pp. 344–357.

*Journal of Vacuum Science and Technology*, "Silylation process based on ultraviolet laser–induced crosslinking", by M. A. Hartney et al., B8(6), (1990) pp. 1476–1480.

*ACS Symposium Series, 412, Polymers in Microlithography*, "Evaluation of Several Organic Materials as Planarizing Layers for Lithographic and Etchback Processing", by L. E. Stillwagon et al., 1989, pp. 220–228.

*SPIE Advances in Resist Technology and Processing*, "Single Level Dry Developable Resist Systems, Based on Gas Phase Silylations", by J. P. W. Schellekens et al., VI(vol. 1086) pp. 220–228.

*SPIE X–Ray/EUV Optics for Astronomy, Microscopy, Polarimetry, and Projection Lithography*, "Resist schemes for soft x–ray lithography" by Gary N. Taylor et al., vol. 1343, (1990), pp. 258–273.

*Primary Examiner*—Cynthia Hamilton
*Attorney, Agent, or Firm*—Richard J. Botos

[57] ABSTRACT

A surface-imaging technique for lithographic processes is disclosed. The lithographic processes are used to manufacture integrated circuit devices. An image is produced on a resist that is applied onto a substrate. The image is produced by exposing selected regions of the resist material to radiation. The selected exposed regions correspond to the image. The resist is then exposed to a silylating reagent that selectively reacts with either the exposed or the unexposed region of the resist. The silylating reagent is combined with a cross-linking reagent. The silylated resist is then subjected to reactive ion etching, which forms an in situ silicon oxide etch mask over the silylated regions of the resist. The mask so formed provides etching selectivity which provides precise image transfer from the resist into the substrate.

22 Claims, 3 Drawing Sheets

SURFACE-IMAGING TECHNIQUE FOR LITHOGRAPHIC PROCESSES FOR DEVICE FABRICATION

STATEMENT OF GOVERNMENT INTEREST IN THE INVENTION

One of the named inventors of the invention described herein was an employee of the U.S. Government at the time the invention was made. Therefore, the invention described herein may be manufactured and/or used royalty-free by or for the United States of Government.

CROSS-REFERENCE TO RELATED APPLICATION

This application is a continuation-in-part of U.S. Ser. No. 08/068485 filed May 28, 1993, which is hereby incorporated by reference.

BACKGROUND OF THE INVENTION

1. Field of the Invention

This invention relates to the in situ formation of an etch mask by using silylating reagents in a lithographic process for device fabrication. The process employs surface-imaging techniques to obtain devices that satisfy fine design rules.

2. Art Background

Design rules for integrated circuit manufacture are becoming increasingly fine. Design rules of 0.5 μm are being replaced by design rules that are less than 0.5 μm. These increasingly fine design rules require processes which can transfer these features into the integrated circuit with concomitant accuracy.

Integrated circuits are manufactured using lithographic processes. A lithographic process employs energy that is introduced onto selected portions of an energy sensitive resist material overlying a substrate. Energy is introduced onto selected portions of the resist through openings in a mask substrate interposed between the energy source and the resist material. These openings in the mask substrate define the pattern. The pattern is transferred into the resist material by the energy that is permitted to pass through the openings in the mask substrate and into the resist. Thus, it is an image of the pattern defined by the mask substrate that is transferred into the resist material.

After the image is transferred into the resist material, the resist material is developed to form a pattern. The pattern is then transferred by etching into the substrate underlying the resist material. Once the pattern is incorporated into the substrate, it becomes a feature of the integrated circuit.

The energy used to expose the resist material, the composition of the resist material, the thickness of the resist material, and many other factors affect the ability of a lithographic process to delineate a feature in a substrate. The smaller the design rule, the more precisely the feature must be delineated.

Another factor which affects the ability of a process to define features in a substrate is the topography of the substrate surface. Substrate surface topography is either planar or non-planar. Non-planar surfaces are referred to as such because their surfaces are not in one single plane. When a resist material is applied over a non-planar substrate, the resist layer only approximately conforms to the non-planar substrate surface. As a result, the distance between the resist surface and the substrate surface tends to be nonuniform. This nonuniformity can adversely affect the pattern developed in a resist material because the depth at which the image is focused in the resist will also vary. If the depth of focus varies over the resist surface, the features resolved in the resist may not satisfy the applicable design rules.

Surface-imaging lithographic processes have been developed which do not require that the resist material be exposed throughout its entire thickness. These processes are referred to as surface-imaging processes because they define features only in the near-surface region of the resist. These surface-imaging resists are particularly useful in lithographic processes which normally define small features over a narrow range of focus. These processes utilize thinner exposed resist layers, have a broader focus range, and ultimately produce more highly resolved features than some processes that use resists that must be exposed throughout their entire thickness. Specifically, surface-imaged resists exhibit increased sensitivity and resolution as the effective resist thickness decreases from 0.5 μm to 0.1 μm depending on the incident radiation and other factors.

A surface-imaging lithographic process which incorporates refractory elements into portions of the resist layer to form an etch mask is described in F. Coopmans, et al. "DESIRE: A New Route to Submicron Optical Lithography", *Solid State Technology*, pp. 93–99 (June 1987). In the surface-imaging process described in this paper, a silylating reagent is introduced into the resist after it is exposed to radiation. Depending upon the changes in the resist caused by the exposure and subsequent processing, the silylating reagent is incorporated in either the exposed region or the unexposed region of the resist material. During plasma development, the silylating reagent forms an etching mask in the region into which it is incorporated. The silylating reagent, therefore, is used to impart a degree of etching resistance to the resist. The ratio of the etching rate in the region incorporating the reagent to the etching rate in the region intended to be substantially free of reagent is known as the etching selectivity. The region into which the silylating reagent is incorporated theoretically etches more slowly than the region into which the silylating reagent is not incorporated.

The resist material described in Coopmans, et al. is spin-deposited directly over a substrate with a non-planar (stepped) surface. An image is formed in the resist material by subjecting the resist material to a standard ultraviolet (UV) light exposure. The Coopmans', et al. article represents that a silicon-bearing material such as the trimethylsilyl group in hexamethyldisilazane (HMDS) is incorporated into the exposed portions of the Plasmask® resist material. Plasmask is a registered trademark of Union Chemic Belgique Corp. The article states that the so silylated Plasmask® is transformed into a silicon-containing image. The image is then incorporated into the substrate using oxygen plasma etching. The article states that the image in the Plasmask® is transformed into a silicon oxide mask because the silicon in the resist material binds with the active oxygen species and forms a loosely structured protective oxide that stops further etching while the other regions in the resist are etched away by an anisotropic reactive ion etching process. The process results in a negative tone relief image.

The process disclosed in C. Garza, et al., "Manufacturability issues of the DESIRE process", *SPIE Advances in Resist Technology and Processing*, VI 1086, pp. 229–237 (1989) is similar. The article states that a photoresist, a combination of novolac-resin/diazoquinone-sensitizer, was spin coated onto a substrate. The photoresist was then selectively exposed to energy. The article theorizes that the diazoquinone decomposed in the exposed region and that this brought about chemical changes in the resist that favored the incorporation of HMDS in these regions. Thus, when the resist was exposed to radiation, heated to crosslink unexposed regions, and then treated with a vapor containing HMDS, the trimethylsilyl group was selectively incorporated into the exposed regions of the resist. The resist was then subjected to a dry etch, such as $O_2$ reactive ion etching. The article states that the etching rate for the area into which HMDS had not been incorporated, was faster than the etching rate for the area in which HMDS had been incorporated. An image corresponding to the negative of the image transferred into the resist was then transferred into the substrate. Garza et al., specify a preference for magnetically enhanced ion etching (MIE) to obtain acceptable resolution and focus latitude. The process described in Garza et al. leaves residues in the unsilylated regions after pattern development which are undesirable.

The surface-imaging process described in C. A. Spence, et al., "Silylation of poly(t-BOC) styrene resists: Performance and Mechanisms", *SPIE Advances in Resist Technology and Processing*, VII, 1262,, pp. 344–350 (1990). employs a single layer of resist material deposited over a substrate. The resist material so deposited is described as a copolymer of styrene and p-tertbutoxycarbonyloxystyrene. The resist described in the article was subjected to a patterned exposure. Upon heating the tert-butoxycarbonyl groups were cleaved from the resist material in the exposed region and replaced by hydrogen. According to the article, this cleavage produces phenolic sites on the polymer.

A silicon-containing material, HMDS, was introduced into the Spence et at. resist layer after the patterned exposure. The HMDS was preferentially absorbed by the polymer in the exposed region. Spence et at. state that this preferential absorption was caused by the presence of phenolic sites on the resist polymer. Spence et al. reported a negative image resulted when the resist so silylated was etched by oxygen ($O_2$) reactive ion etching.

M. A. Hartney, et at., "Silylation processes based on ultraviolet laser-induced crosslinking", *Journal of Vacuum Science and Technology*, B8(6), pp. 1476–1480 (1990) reports that a phenolic resin was spin-deposited onto a substrate. The exposed resin was then subjected to a patterned exposure. The resist material in the exposed region reportedly underwent crosslinking, while the resist material in the unexposed region reportedly did not. The resist material was then silylated. Dimethylsilyldimethylamine (DMSDMA) was used as the silylating reagent. The DMSDMA selectively diffused into the uncrosslinked regions of the resist material, and reacted with it to provide a positive-tone etch mask. The silylated resists were then etched in a parallel plate reactive ion etching system.

The purpose of the in situ etch masks described in the articles enumerated above is to impart etching selectivity between the exposed and unexposed regions of the resist material. The greater the etching selectivity, the better the resolution between the exposed and unexposed regions during development. In some of the processes described in the references that were previously discussed, adequate etch selectivity was not achieved. In Garza et at., residues were observed which indicates inadequate etch selectivity. Therefore, a surface-imaging process that provides better etch selectivity than the processes described above is desired.

SUMMARY OF THE INVENTION

A process for manufacturing integrated circuit devices is disclosed. In this process an imaging layer containing a polymeric resist material is deposited on a substrate. A latent image is transferred onto the imaging layer by exposing the imaging layer to radiation either by projection or by direct imaging at the resist surface. This "imagewise" exposure creates an image in the resist by exposing only certain portions of the resist layer to radiation. If a mask is used in the process, the mask defines the image that is transferred into the imaging layer. The unexposed and exposed regions of the imaging layer together define the latent image projected in the imaging layer. A refractory material is then introduced into the imaging layer. The refractory material is a silylating reagent such as HMDS, tetramethyldisilazane and the disilanes described in parent application, U.S. Ser. No. 08/068485, which is hereby incorporated by reference. The purpose of the selective silylation of the imaging layer is to form an etch mask in situ. The silylated portion of the resist layer will etch more slowly than the unsilylated portions. Thus, silylation introduces etching selectivity into the resist material. If the silylating agent does diffuse appreciably into both the exposed and unexposed regions of the resist, then the desired etching selectivity will not be achieved. If the desired etching selectivity is not achieved, the features of the integrated circuit produced will not be delineated.

In the process of the present invention, a cross-linking reagent is introduced along with the silylating reagent. The cross-linker is selected such that the combination of cross-linker and silylating reagent is about 0.5 to about 25 volume percent cross-linker. It is advantageous if this combination is about 0.5 to about 5 volume percent cross-linker.

Suitable cross-linkers are characterized by the general formula

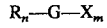

$$R_n-G-X_m$$

wherein n is either zero or an integer greater than or equal to one and m is an integer greater than or equal to 2. In this cross-linker, R n is a group that preferentially remains bound to the connecting moiety G when the cross-linker is combined with the silylating reagent and introduced into the energy sensitive resist. The connecting moiety G is also bound to reactive groups $X_m$ which preferentially react with the resist polymer instead of the silylating reagent.

Groups $R_n$ are typically alkyl groups such as methyl groups, ethyl groups, etc., or hydrogen atoms. However, groups $R_n$ are not limited to these compositions and structures. Many different structures and compositions are contemplated, as long as the $R_n$ groups are unreactive in the silylating environment and remain bound to the G groups under the silylating conditions of the present process.

The reactive groups $X_m$ also have a variety of compositions and structures. Suitable compositions and structures are determined, at least in part, by the connecting moiety G and the bond between G and $X_m$. For example, if G is silicon (Si), R is methyl, and n=2, then dimethylamino, diethylamino, bromo, chloro, fluoro, and iodo groups are examples of suitable X groups. The reactive group in the resist being cross-linked is another factor that determines suitable X groups. For example, when the resist polymer is a phenolic resin, the above enumerated X groups will react with available phenolic moieties in the resist.

A variety of moieties are suitable for use as a connecting group G. These moieties vary from a single silicon atom to a more complex species such as 1,4-xylene or 1,4-butylene. Other refractory atoms such as titanium are also contemplated as suitable, but non-refractory atoms such as carbon, nitrogen, oxygen, phosphorous and sulfur are also contemplated as suitable.

Additional considerations govern the selection of suitable R, X, and G moieties in the cross-linker. For example, it is advantageous if the cross-linker is uniformly dispersed in the silylating reagent. Therefore, the cross-linker must be sufficiently soluble in the silylating reagent to be uniformly dispersed therein. It is also advantageous if the vapor phase concentration of the cross-linker is within thirty percent (plus or minus) of the liquid phase composition of the silylating reagent, i.e. the boiling point of the cross-linker and the silylating reagent should be within about 20° C. of each other. It is also advantageous if the cross-linker reacts with the resin at a rate that is within thirty percent of the rate at which the silylating reagent reacts with the resin. Also, it is desirable if the cross-linker does not readily react with the silylating reagent and does not significantly decompose in the silylating tool.

Since the objective of silylation is to introduce an etching selectivity into the energy sensitive resist material, it is advantageous if the cross-linker contains refractory atoms such as silicon. In this regard it is advantageous if G is either Si or $Si_2$. The presence of these refractory atoms in the cross-linker is particularly advantageous when the amount of cross-linker is a significant volume percent (i.e. about 20 to about 25 volume percent) of the silylating reagent/crosslinker combination. At lower concentrations, the presence of refractory atoms in the cross-linker is not as necessary because the cross-linker is displacing a lesser amount of the silylating reagent.

For example, if the resist to be silylated contains amine or alcohol reactive groups, suitable silylating reagents include halosilanes or halodisilanes. Under these circumstances, dihalosilanes or dihalodisilanes are suitable crosslinkers. However, if the amount of cross-linker is less than about 20 volume percent, then non-silicon-containing cross-linkers such as 1,3 dibromopropane or methylene iodide are also contemplated as suitable. In a preferred embodiment, the crosslinking reagent is characterized by the general formula:

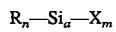

$$R_n\text{—}Si_a\text{—}X_m$$

wherein a is greater than or equal to one, n is less than or equal to 2a and X is greater than or equal to 2.

In the cross-linking reagent, X is a reactive group that is selectively cleaved from the disilane upon reaction with the polymeric resist material in either the exposed region or the unexposed region of the imaging layer. Exemplary X groups include N,N-dimethylamino, N,N-diethylamino, N-methylamino, N-ethylamino, other amino groups, and azido, fluoro, chloro, bromo, iodo, cyano and thiocyano groups. Preferably, X is N,N-dimethylamino, N,N-diethylamino, or N-methylamino. Although, from a synthesis standpoint it is advantageous if both X groups are the same, it is contemplated that they could be different groups selected from the above-enumerated moieties. In one embodiment, the cross-linker is 1,2-bis -(N,N-dimethylamino)tetramethyldisilane. In another embodiment, the cross-linker is bis-(N,N-dimethylamino)methylsilane or bis-(N,N-dimethylamino)dimethylsilane. Because the cross-linking reagent has two such X groups, the cross-linking reagent reacts with two reactive sites in the polymeric resist material. Consequently, the remaining moiety —$Si_aR_n$— forms a silicon containing cross-link between two reactive sites on the polymer. This cross-linking restricts and confines the amount by which the silylated resist swells as a result of the incorporation of the silylating reagent therein and thereby contains the flow of the silylated regions.

The R groups are typically either hydrogen (H) or methyl ($CH_3$) groups. Each of the R groups in the cross-linker is either the same as or different from the other R groups. It is advantageous if the number of hydrogens per silicon atom is either zero or one. The other R groups are methyl groups. If the cross-linker contains multiple silicon atoms, the relative number of hydrogen and methyl groups on each silicon atom may vary.

The cross-linking reagent is incorporated into the resist polymer via any suitable mechanism that promotes attachment of the cross-linker to the resist polymer in the silylated portion of the imaging layer. For example, the X group reacts with a group pendant to the resist polymer. Via this reaction, the cross-linker binds to the polymer. The second X group in the cross-linking reagent then reacts with another group pendant to the resist polymer. This cross-links the resist polymer, which reduces the amount of flow caused by the incorporation of the silylating reagent into the resist polymer. In this regard, it is advantageous if the resist polymer has hydroxyl (—OH) moieties pendant thereto to facilitate the cross-linking reactions. Novolac resins such as the M-cresol formaldehyde resins found in positive energy sensitive resist materials, contain a suitable number of hydroxyl moieties, (e.g., one per repeat unit). Novolac resist materials are available commercially and are wellknown to those skilled in the art.

Because this surface-imaging process is used to develop images in resists over non-planar as well as planar substrate surfaces, a planarizing layer is preferably deposited onto the substrate before the imaging layer is deposited on the substrate. The planarizing layer is a thicker layer of hardened organic film or other suitable material. These materials include hardened positive photoresists. Examples of these photoresists include HPR-204, which is commercially obtained from OCG Microelectronics in Patterson, N.J., and SPR-1811 and SPR-513 which are commercially obtained from Shipley Co. in Marlborough, Mass. Hardened or cured planarizing coatings such as those discussed in Stillwagon, L. E. and Taylor, G. N., "Evaluation of Several Organic Materials as Planarizing Layers for Lithographic and Etchback Processing", *Polymers in Microlithography*, 412:252–265 (ACS Symposium Series, 1989) are also acceptable materials for use as a planarizing layer. The planarizing layer is preferably crosslinked to a sufficient degree to prevent the silylating reagent from diffusing into this layer. If the silylating reagent diffuses into the planarizing layer to a significant extent and if it remains in the planarizing layer after the silylation step, then the etching selectivity between the silylated and unsilylated portions of the resist layer may be adversely affected.

DETAILED DESCRIPTION

Figure 2:
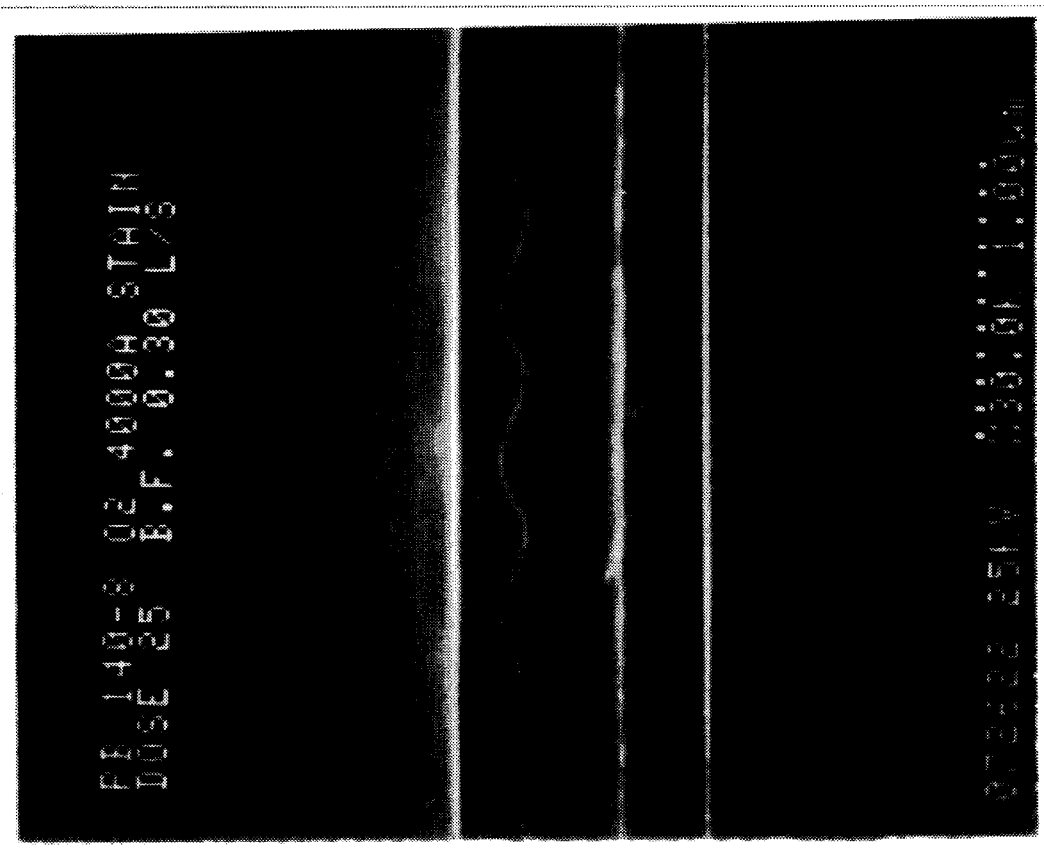
FIG. 2 is a photograph of a resist that was silylated with a cross-linker.

The disclosed process utilizes surface-imaging techniques to produce an integrated circuit with submicron features.

The process uses an etching mask which is formed in situ within the near surface portions of an imaging layer. The process introduces etching selectivity into the near surface portions of an imaging layer by incorporating a silylating reagent into certain regions of the imaging layer.

The imaging layer is deposited on top of a substrate, preferably a silicon substrate. The imaging layer is then exposed to radiation. Preferably, only selected portions of the imaging layer are exposed to radiation. The unexposed and exposed regions of the imaging layer together define a pattern.

The pattern is transferred onto the imaging layer in a number of ways. One way is by directing a beam of energy, such as electron beam energy, to only certain controlled portions of the imaging layer. Another is by interposing a mask substrate between an energy source, such as a light source, and the imaging layer. The patterned mask substrate defines a pattern. The energy passes through the openings in the mask substrate. The image defined by the mask substrate is, thus, transferred into the imaging layer. Only certain portions of the imaging layer are, thus, exposed to the radiation.

The imaging layer is made of a resist material. Radiation induces chemical changes in the resist material in the imaging layer. These chemical changes introduce a selectivity into the resist material. A silylating reagent that will selectively react with the resist material in one of either the exposed or unexposed regions, but not both, is introduced into the imaging layer. The silylating reagent preferentially reacts with the resist material in only one region. Due to this preferential reaction, the silylating reagent selectively diffuses into one of the exposed or unexposed regions of the resist material. This reaction and resulting diffusion cause the resist material in the affected region to swell. The coated substrate is then subjected to reactive ion etching, preferably $O_2$ reactive ion etching, which causes silicon oxides to form in the surface of the silylated resist material, thereby forming an etch mask in situ over the silylated portions of the resist material.

The mask so formed provides etching selectivity to the surface of the imaging layer. In this manner, fine features can be developed in the substrate. Since this process does not require the imaging layer to be exposed throughout its entire thickness, it is characterized as a surface-imaging process.

The imaging layer is deposited onto the substrate by any acceptable technique including, for example, spin-deposition. The substrate on which the imaging layer is so deposited has either a planar or a non-planar surface.

As mentioned previously, it is important that the image produced in the resist material be free from linewidth variations and defects that are not within acceptable manufacturing tolerances. The possibility and degree of linewidth variations and other defects are reduced if the imaging layer has a more uniform, i.e. planar, surface. The quality of the image is also enhanced if energy that passes through the resist material does not reflect back into the resist material from the substrate.

If a planarizing layer is interposed between the substrate and the imaging layer, the surface of the imaging layer can be more planar. Non-planar substrate surfaces have many different high and low areas. When a layer of material, such as an imaging layer, is deposited over such a surface, it too will have high and low areas that can cause variations in the thickness of this layer.

A planarizing layer deposited over the non-planar substrate surface provides a more planar surface on which to deposit the imaging layer. An imaging layer deposited over a planarizing layer tends to have a more uniform thickness than an imaging layer deposited directly over a non-planar substrate.

The planarizing layer preferably prevents the silylating reagent from diffusing into it. The planarizing material accomplishes this objective by providing either a physical barrier or a chemical barrier to the diffusion of the silylating reagent.

The planarizing layer preferably erects a physical barrier through which the silylating reagent cannot diffuse. An example of a planarizing layer material that, when crosslinked, forms an effective barrier through which the organodisilane cannot significantly diffuse is Shipley SPR-1811. This material provides an effective diffusion barrier when thermally hardened.

The planarizing layer also provides a chemical barrier through which the silylating reagent cannot readily diffuse. This barrier is also formed by crosslinking the planarizing material. However, planarizing materials that provide an effective barrier to the diffusion of the reagent, but which are not crosslinked, are also contemplated.

An uncrosslinked planarizing layer can act as a diffusion barrier by having certain properties. The organodisilanes, for example, diffuse more readily into a hydrophobic environment. Therefore, a hydrophilic planarizing layer will more readily act as a diffusion barrier than a hydrophobic planarizing layer (provided that the organodisilanes do not react with the hydrophobic layer). The rate at which the organodisilane diffuses into the planarizing layer is also dependent on the degree to which the organodisilane reacts with the resist. Consequently, a planarizing layer will provide an effective barrier to the diffusion of the organodisilane if it is a hydrophilic material that does not readily react with the organodisilane.

Whether of not the planarizing layer is crosslinked, the material used for the planarizing layer must have acceptable processing characteristics for use in a lithographic process. For example, the planarizing layer material must not significantly intermix with the above imaging layer and must be compatible with processes used to transfer the pattern into the substrate. Also, the planarizing layer material must be thermally and mechanically stable at temperatures of up to about 200° C.

The imaging layer contains a material which, when exposed to energy, undergoes a chemical change, creating differences between the exposed and unexposed resist material which can be exploited in a lithographic process. For example, the resist material is made of a polymer that crosslinks when exposed to the type of radiation used to transfer the pattern into the resist layer. Crosslinking is one example of a mechanism employed to cause the organodisilane to diffuse selectively into either the exposed or unexposed regions of the imaging layer. Because of the stereochemical nature of the organodisilane, the organodisilane does not readily diffuse into the crosslinked regions of the imaging layer.

Diffusion of the silylating reagent is promoted by the presence of reactive moieties that are pendant to the resist polymer. Examples of such reactive moieties include hydroxyl groups, imide groups, and sulfonamide groups that are pendant to the polymer backbone, or polymers in which these reactive moieties are pendant to substituents that are, in turn, pendant to the polymer backbone. These reactive moieties are either pendant in one of either the exposed or the unexposed regions of the imaging layer, or they are pendant to the resist polymer in both regions. Even if these moieties are present in both regions, however, they are susceptible to reactions with the silylating reagent in only one region. This selective silylation is also promoted by a mechanism such as crosslinking the resist polymer as described above. Since the silylating reagent cannot penetrate into the crosslinked areas of the imaging layer, it cannot react with the moieties pendant to the crosslinked polymer in the crosslinked region. Therefore, the imagewise exposure of the resist material introduces a selectivity into the resist material which facilitates selective silylation of the resist material.

Examples of suitable resist polymers include poly(vinyl alcohol) and its vinylacetate copolymers, poly(vinylphenol), poly(vinylmethylphenol)s, the cresol novolacs, poly(vinylresorcinol), poly(vinylcatechol), poly(vinylpyrogallol), resorcinol novolac, catechol novolac, the poly(vinylphenol)s, and the phenol novolacs.

Selection of a particular resist polymer for the imaging layer is largely a matter of design choice. The type of radiation to which a resist polymer is sensitive varies with the resist polymer. However, resist polymers that are sensitive to UV radiation (wavelengths of about 100 nm to 300 nm) and x-ray radiation (1 nm to 100 nm) are contemplated as suitable.

Particularly advantageous resist polymers include a commercially obtainable resist material, Shipley XP 8844. This material is a proprietary composition of the Shipley Co. The composition is a mixture of a resist polymer, a crosslinking reagent, and a photoacid generator. The imaging layer has an absorbance of about 0.94 at a wavelength of 248 nm which is in the ultraviolet (UV) range (about 100 nm to about 300 nm), for a 1 μm thick film of this preferred resist polymer. An absorbance over the range of 0.1 to 2 per μm at a wavelength of 248 nm is contemplated. This material is a chemically amplified resist and is so termed because a number of chemical reactions are initiated by a single interaction between the energy source and the resist polymer.

The crosslinking reaction of the resist polymer is either induced by acid that is generated by the resist material itself when exposed to radiation, or induced by a photoacid generator mixed into the resist material to generate the acid. The acid so generated initiates the crosslinking reaction. Examples of suitable photoacid generators include 2,6-dinitrobenzyl tosylate, brominated aromatic compounds, and iodonium salts such as di-(4-t-butylphenyl)iodonium trifluoromethane sulfonate. The imaging layer is optionally a non-chemically amplified resist such as phenolic resist materials containing azido moieties and no photoacid generators.

After exposure, the resist film is subjected to a post-exposure bake (PEB). The temperature at which the PEB occurs is below the temperature at which crosslinking of the resist in the unexposed areas would be induced. That temperature is below 150° C. Preferably, the PEB occurs at or below 130° C.

After the exposed resist material has been subjected to the post-exposure bake, the silylating reagent is introduced into the material. Suitable silylating reagents include disilazanes such as hexamethyldisilazane and tetramethyldisilazane. Mechanisms for incorporating these silylating reagents into resist polymers are disclosed in U.S. Pat. No. 4,552,833 which is hereby incorporated by reference. Other suitable silylating reagents include the organodisilane described in Wheeler, D., et at. "New silicon-rich silylating reagents for dry-developed positive-tone deep-ultraviolet lithography," *J. Vac. Sci. Technol. B*, 11 (6), pp. 2789–2793 (1993) which is hereby incorporated by reference.

The silylating reagents described above cause the polymers in which they are incorporated to swell. Phenomena associated with this swelling can have undesirable lithographic consequences. Accordingly, it is advantageous to lightly cross-link the silylated resist polymer to reduce the amount of flow that results from silylation. In the process of the present invention a disilane cross-linking reagent is used to achieve a two-fold advantage: 1) reduce the flow during and after silylation; and 2) introduce more silicon into the resist polymer.

The cross-linker is selected such that the combination of cross-linker and silylating reagent is about 0.5 to about 25 volume percent cross-linker. It is advantageous if this combination is about 0.5 to about 10 volume percent cross-linker.

Suitable cross-linkers are characterized by the general formula $R_n$—G—$X_m$ wherein n is either zero or an integer greater than or equal to one and m is an integer greater than or equal to 2. In this cross-linker, $R_n$ is a group that preferentially remains bound to the connecting moiety G when the cross-linker is combined with the silylating reagent and introduced into the energy sensitive resist. The connecting moiety G is also bound to reactive groups $X_m$ which preferentially react with the resist polymer over the silylating reagent. In this general formula, $R_n$, G, and $X_m$ are as previously described.

It is advantageous if the cross-linking reagent has the general structure:

$$R_n\text{—Si}_a\text{—}X_m$$

wherein a is greater than or equal to one, n is less than or equal to 2a, and m is greater than or equal to 2.

The silylating reagent is incorporated into the silylated portion of the resist. One example of a reaction by which the cross-linker reagent is incorporated into the resist is illustrated by:

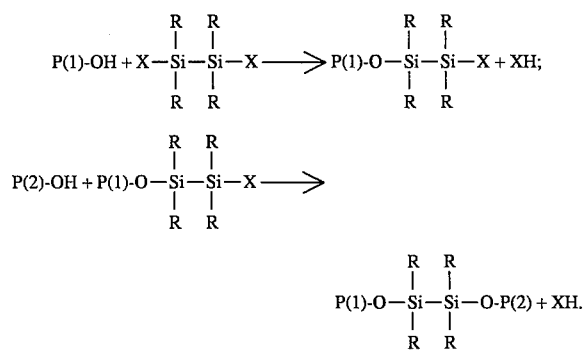

In the above example, one X moiety reacts with an OH moiety on the polymer P(1) causing the cross-linker to bind to the polymer. The second X moiety then reacts with another OH moiety on the polymer P(2) causing the cross-linker to bind to P(2). In this manner P(1) and P(2) are cross-linked.

X in the cross-linking reagent is preferably N,N-dimethylamino, N,N-diethylamino, N-methylamino, N-ethylamino and other amino groups, and azido, fluoro, chloro, bromo, iodo, cyano and thiocyano groups. It is contemplated by this invention, however, that X is any reactive group which can be attached to the cross-linking disilane and which facilitates binding and diffusion of the cross-linker into the resist material.

In this regard it is advantageous if the cross-linking reagent does not react preferentially with the silylating reagent. Therefore, the cross-linking reagent is chosen with the silylating reagent in mind. For example, if the silylating reagent has amino reactive groups, it is advantageous if X is an amino group as enumerated above and not a cyano or halo group.

In the above formulation, each of the R groups are the same or different. The R groups are either hydrogen (H) or alkyl, preferably methyl ($CH_3$), groups. It is advantageous if the number of hydrogen atoms is either zero or one, the remaining R groups being methyl groups.

The number of hydrogen and methyl groups on the cross-linker affects its properties. Cross-linkers with fewer methyl groups react more readily with the resist polymer, but are less stable than cross-linkers with more methyl groups. The less stable cross-linkers will react with the silylating reagent with which they are incorporated into the resist polymer. Significant reaction with the silylating material is avoided if the cross-linker has at least one methyl group per silicon atom.

Examples of suitable cross-linkers include 1,2- bis-(N,N-dimethylamino)tetramethyldisilane, bis-(N,N-dimethylamino)methylsilane, and bis -(N,N-dimethylamino)dimethylsilane. The cross-linking reagent is usually in a gaseous state when introduced into the resist material along with the silylating reagent. However, if the silylating reagent is applied as a liquid in solution, the cross-linker is also incorporated into the liquid or solution. For gaseous reactions the silylating temperature is about 50° C. to about 150°. Silylation occurs under a pressure that is less than atmospheric, preferably in the range of about 10 Torr to about 200 Torr. Preferably silylation occurs in a pressure range of about 10 Torr to about 100 Torr. It is advantageous if the pressure is about 30 Torr. The silylating reagent is either introduced as a single gaseous species, or combined with another gas in which the partial pressure of the silylating reagent is about 0.1 to about 0.99 of the total pressure of the silylating atmosphere.

If the silylation occurs in solution, the solvent is preferably a nonsolvent for the imaging layer resist material. A small amount of solvent that normally dissolves the resist material is included in the solution, however, to slightly swell or extract the resist material from the imaging layer in order to aid diffusion and binding of the silylating reagent into the imaging layer. When silylation takes place in solution, the solution temperature is preferably about 25° C. but may be either higher or lower.

As the silylating reagent is introduced into the resist material, the portions of the resist material into which the silylating reagent diffuses begin to swell. For a 0.22 μm thick layer, the volume of the silylated resist film has been observed to increase about 60 percent to 70 percent or more over the volume of the unsilylated resist material using Shipley XP 8844 as the resist polymer and N,N-dimethylaminopentamethyldisilane as the silylating reagent. Preferably, this volume increase is manifested vertically and not laterally in the resist film. If the volume increases too much, it may lead to distortion of the latent image defined by the in situ mask. Therefore, controlling the shape of the silylating region and minimizing flow is desirable.

After the resist material has been silylated, it is etched. Preferably, reactive ion etching is used to etch the silylated resist material. The reactive ion etching preferably takes place in a plasma that contains a reactive oxygen species. Gases from which such oxygen species can be produced include $NO_2$, $NO$, $CO_2$, $SO_3$, $SO_2$, $O_2$, and other such gases.

When the silylated film is subjected to such etching, the silylated portions of the resist film are oxidized, thereby forming in situ a silicon oxide mask on the silylated portions of the resist film. This mask etches about forty-five to about twenty-eight times more slowly than the unsilylated material depending upon the specific etch conditions. These differences in etch rates were observed when the unsilylated material was etched at rates of about 1.65 μm/min to about 1.2 μm/min, respectively. Etching occurs at temperatures of about −50° C. to about 50° C.

The following examples illustrate specific embodiments of the invention. These examples can be modified in many ways that fall within the scope of the present invention as defined by the claims. Such modifications are also within the scope of the present invention.

EXAMPLE 1

Preparation of Chloropentamethyldisilane

A three-necked, 2-liter, round-bottom flask with an overhead stirrer, thermometer, powder addition funnel, and a large diameter gas inlet/outlet was flame dried under an argon atmosphere. Hexamethyldisilane (198.1 g; 1.35 moles) and concentrated sulfuric acid (400 ml) were quickly added to the flask. The resulting mixture was vigorously stirred and gas evolution began immediately. The flask was cooled to maintain the temperature in the range of about 20° C. to 30° C. The gas evolution diminished after about three and one-half hours. The resulting mixture was observed to be homogeneous.

The mixture was then cooled to about 15° C. The powder addition funnel of the flask was charged with ammonium chloride powder (106 g; 1.98 moles). The ammonium chloride powder was added over the course of two hours. The resulting mixture was allowed to warm to room temperature while being stirred. This warming step took approximately 1 hour. Two layers formed and the top layer was separated from the bottom layer using a one liter separatory funnel maintained under an argon atmosphere. The top layer was then distilled at 120°– 135° C. in a short path distillation apparatus. The resulting distillate was then more carefully distilled through a 30 cm Vigreux column. The product obtained (134.7 g; 0.808 moles) gave a 60% yield of chloropentamethyldisilane with a purity greater than 96%. The product was subjected to NMR testing and the results were $^1$H NMR (360 MHz, $C_6D_6$): δ50.061,(s, 9H),0.333(s, 6H). $^1$HNMR for this and all other examples were taken using a Bruker 360 MHz NMR Spectrometer.

EXAMPLE 2

Preparation of N,N-Dimethylaminopentamethyldisilane

A 2-liter flask equipped with an overhead stirrer, thermometer, addition funnel, and a -78° C. condenser having a gas inlet was charged with 2.5 M n-butyllithium (200 ml; 0.5 moles). The solution was cooled to −78° C. Anhydrous diethyl ether (800 ml) was then added to the solution. Anhydrous dimethylamine (136 g; 3 moles) was then condensed into the flask. Then chloropentamethyldisilane (110 g; 0.684 moles), dissolved in liquid pentane (200 ml) was added to the resulting suspension of lithium dimethylamide and diethyl ether via the addition funnel in the flask over a period of three hours.

The resulting mixture was allowed to warm to room temperature and stand overnight. The mixture was then filtered in a glove bag using a filter funnel having a sintered glass frit. The mixture was distilled to remove the solvents. The product (103 g; 0.588 moles) was obtained by distillation (boiling point of 150° C. to about 155° C.), for an 86% yield. The product obtained was N,N-dimethylaminopentamethyldisilane that was greater than 98% pure. The product was subjected to NMR testing and the results were $^1$H NMR (360 MHz, CDCl$_3$): δ0.047, (s, 9H), 0.084 (s, 6H), 2.43 (s, 6H).

EXAMPLE 3

Preparation of N,N-Dimethylaminopentamethyldisilane

A dry 500 ml round-bottom flask equipped with a condenser, inlet, and septum was charged with hexamethyldisilane (7.03 g; 49.9 mmole) through the septum using a syringe. The flask was provided with an argon atmosphere via the inlet. Anhydrous trifluoromethanesulfonic (triflic)acid (5.8 ml; 7.7 g; 51 mmole) was added to the flask via the septum using a Teflon/glass syringe over a period of about 10 minutes.

Gas and heat evolved from the stirred mixture, which was maintained at room temperature using a water bath. The resulting product was determined to be pentamethyldisilyl triflate from the NMR analysis for the product, $^1$H NMR (360 MHz, CDCl$_3$): δ0.18 (s, 3H), 0.53 (s, 2H); C NMR (90 MHz, CDCl$_3$): δ-3.72, -0.62, 118.51 (q, $J_{CF}$=317 Hz), which was consistent for the structure of this compound. C NMR data were obtained using the same spectrometer as in Example 1.

Dry pentane (300 ml) was added to the product mixture via a cannula. The resulting solution was cooled to about 0° C. Anhydrous dimethylamine (15 g, 0.33 mole) was then bubbled into the solution using a needle. A white precipitate formed immediately. The mixture was then allowed to warm to room temperature after which the excess amine was vented. The mixture was then filtered through a sintered glass frit using a Schlenk line technique. The solvent in the mixture was removed by distillation. Another distillation was performed to obtain product (7.15 g; 40.7 mmole) for an 81% yield of N,N-dimethylaminopentamethyldisilane. The product was subjected to NMR testing and the results were $^1$H NMR (360 MHz, CDCl$_3$): δ0.47 (s, 9H), 0.084 (s, 6H), 2.43 (s, 6H).

EXAMPLE 4

Preparation of N-Methylaminopentamethyldisilane

A 1-liter, round-bottom flask with a −78° C. condenser, powder addition funnel, and a gas inlet/outlet was flame dried under an argon atmosphere. Anhydrous methylamine (80 ml) was condensed into the flask. Diethyl ether (300 ml) was then added to the solution, which was then cooled to −78° C. Chloropentamethyldisilane (19.1 g; 0.114 moles) was mixed with an equal volume of anhydrous diethyl ether and the mixture was added to the flask via the addition funnel. The solution of chloropentamethyldisilane and ether was added to the solution in the flask over the course of one hour and a precipitate formed.

When the solution was warmed to room temperature, the excess methylamine gas was vented from the flask. The mixture was filtered using a Schlenk line technique and the solvent was removed from the mixture via distillation. Product (14.335 g; 89 mmole) was obtained by another distillation at about 146 to 147° C. to give a 78% yield. The product was N-methylaminopentamethyldisilane which was subjected to NMR testing. The results were $^1$H NMR (360 MHz, C$_6$D$_6$): δ0.0951 (s, 9H), 0.121 (s, 6H) 2.37 (d, J=6.5 Hz, 3H); $^{13}$C NMR (90 MHz, C$_6$D$_6$): δ-2.15, -1.74, 28.48.

EXAMPLE 5

Preparation of 1,2-Dichlorotetramethyldisilane

A 500 ml three-necked round bottomed flask was fitted with an additional funnel, a condenser, a septum and a magnetic stir bar. The flask was charged with anhydrous aluminum trichloride (36.5 g; 0.274 moles), evacuated and backfilled with argon. To the aluminum trichloride was added hexamethyldisilane, (20 g; 0.137 moles). The addition funnel was charged with acetyl chloride, (21.45 g; 0.273 moles) and the acetyl chloride was added slowly to the suspension over the course of 30 minutes. The temperature was maintained at about 25° C. with a water bath. After the addition, the solution was heated to 130° C. for an hour. From the reaction mixture of 1,2-dichlorotetramethyldisilane (24.7 g; 0.1342 moles; 97 %) was isolated by vacuum distillation. The $^1$H NMR(CDCl$_3$) singlet at 0.55 ppm, was consistent with the 1,2-dichlorotetramethyldisilane structure.

EXAMPLE 6

Preparation of 1,2-bis-(N,N-Dimethylamino)tetramethyldisilane

A 1 liter three-necked flask fitted with a condenser, a magnetic stir bar and two septums was charged with diethyl ether (700 ml) and 1,2-dichlorotetramethyldisilane (24.3 g; 0.13 moles). The solution was cooled to 0° C. and excess anhydrous dimethylamine was bubbled into the solution. To the resulting suspension was added sodium hydride (6 g; 0.25 moles) and the suspension was stirred overnight at room temperature. The suspension was Schlenk filtered. The ether was distilled from the filtrate and the product was distilled at 190°–192° C. (uncorrected) to give 20.2 grams of a liquid (0.099 moles, 76%). The $^1$H NMR(CDCl$_3$) spectrum showed two equal intensity singlets at 0.1 ppm and 2.45 ppm consistent with the structure for the 1,2-bis-(N,N-dimethyl)tetramethyldisilane.

EXAMPLE 7

Silylation of resist polymer using silylating reagent with cross-linker incorporated therein A silicon wafer (5" diameter) was spin coated with SPR 1811 (obtained from the Shipley Co.) at a speed of 4000 rpm for 1 minute and then heated at 210° C. on a hot plate for 5 minutes. The resulting film was 0.7 μm thick. The coated wafer was subsequently spin coated with XP-8844B (obtained from the Shipley Co.) at a speed of 3000 rpm for 2 minutes. This second coating had a film thickness of 0.2 μm. The coated substrate was then heated to 140° C. on a hot plate for 2 minutes. No intermixing between the two layers was observed.

The resulting wafer with the bilayer resist coated thereon was exposed to radiation at a wavelength of 248 nm using a 0.53 NA (numerical aperture) GCA XLS exposure tool. The exposure dose was 48 mJ/cm$^2$. The exposed wafer was then baked at a temperature of 110° C. for two minutes. The coated wafer was then silylated with the vapor from a mixture of 1,2- bis-(N,N-dimethylamino)tetramethyldisilane (5% by volume) prepared as described in Example 10 above in N,N-dimethylamino pentamethyldisilane using a Model 150 Monarch, Inc. Universal Vacuum Processing Module at a temperature of 95° C. for 2 minutes at a pressure of 30 Torr.

The silylated coated wafer was then etched in a Lucas-Signatone, Inc. Model 5410 Vortex® helicon source etcher in a two-step process. First, the wafer was etched with a mixture of argon and chlorine for 20 seconds. The flow rates were 45 sccm for argon and 5 sccm for chlorine at a pressure of 2 mTorr. The source power was 2500 W, the chuck power was 60 W and the wafer temperature was 25° C. The wafer was etched using an etchant gas that was a mixture of $SO_2$ and $O_2$ for 63 seconds. The flow rates were 55 sccm for $SO_2$ and 14 sccm for 02 at a pressure of 2 mTorr. The source power was 2500 W, the chuck power was 75 W and the wafer temperature was maintained at 25° C. Positive-tone 0.25 μm line and space features were resolved. The features had an aspect ratio of 3.2 and vertical line edge profiles of at least 90 percent. No substantial edge roughness was observed.

Figure 1:
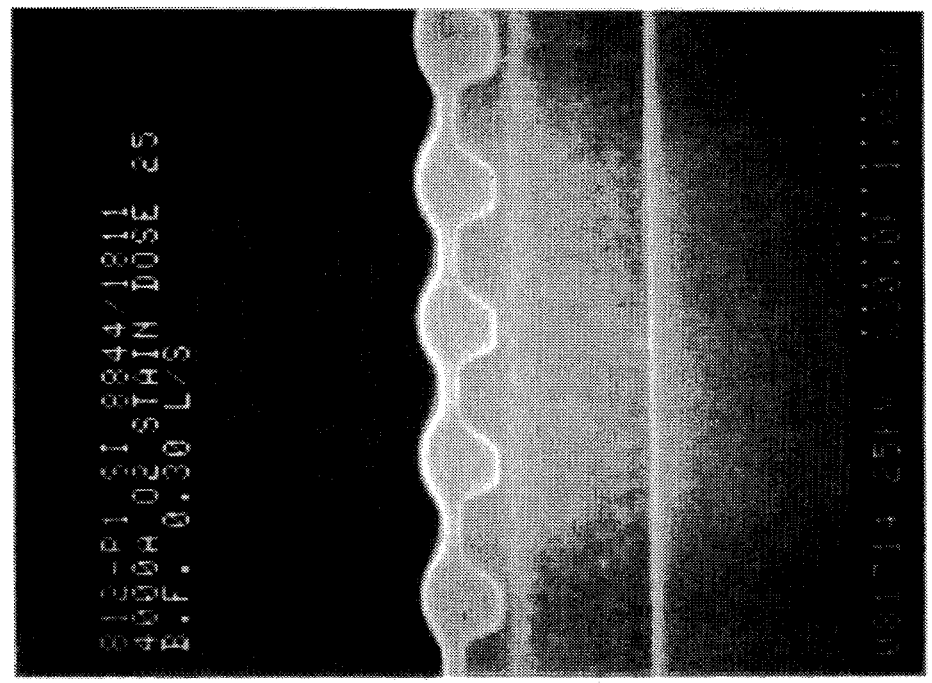
FIG. 1 is a photograph of a resist that was silylated without a crosslinker.

FIGS. 1–6 are photographs which illustrate the effects of combining a cross-linker with a silylating reagent. FIG. 1 is a photograph of a novolac resist that was silylated without a cross-linker and FIG. 2 is a photograph of a novolac resist that was silylated with a cross-linker. Except for the cross-linker, the same conditions were used for both silylations. FIG. 1 illustrates that the silylated resist had a uniform surface over the silylated and the unsilylated regions, which indicates that the silylated resist flowed into the unsilylated resist. FIG. 2 illustrates that this flow was reduced when a cross-linker was used, the silylated resist peaks indicating that the silylated region was confined by the cross-linker.

Figure 4:
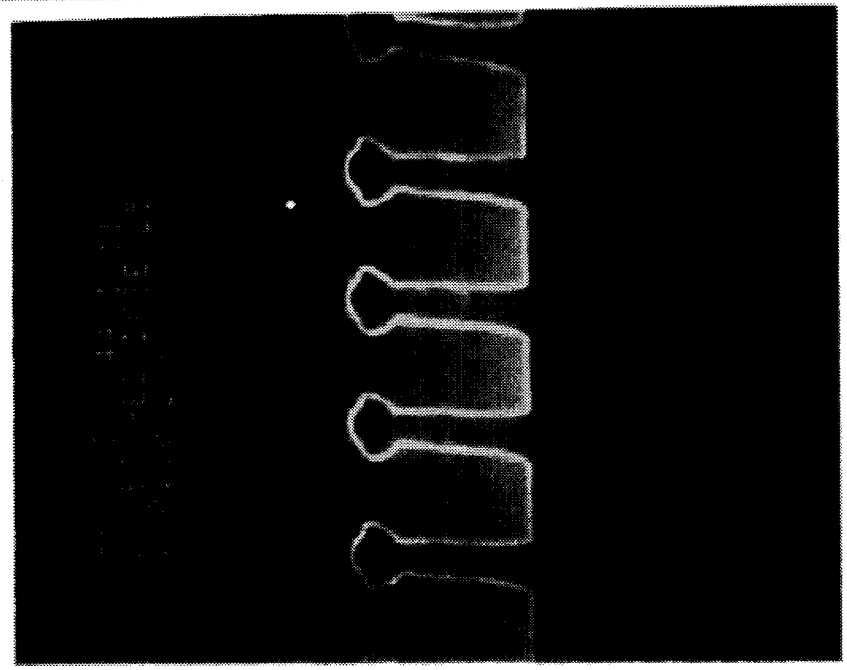
FIG. 4 is a photograph of the fully-etched silylated resist of FIG. 2.
Figure 3:
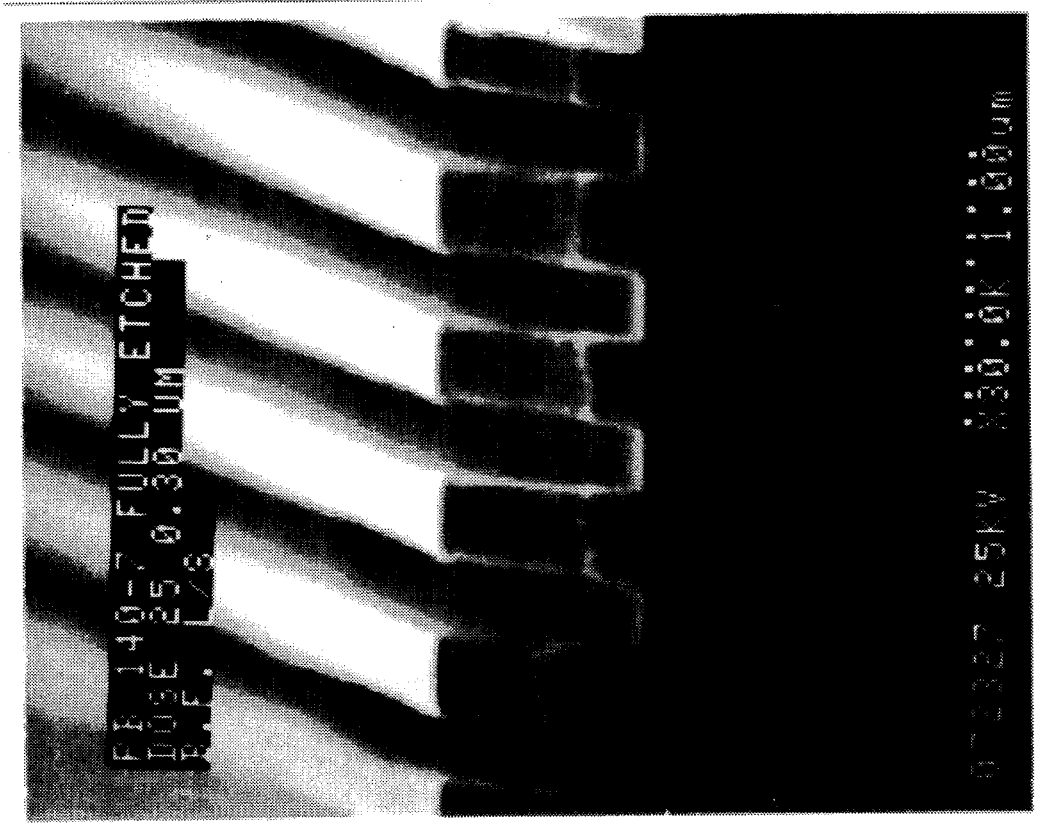
FIG. 3 is a photograph of the fully-etched silylated resist of FIG. 1.

FIGS. 3–6 illustrate the advantages of cross-linking the silylated resist according to the process of the present invention. FIG. 3 is a photograph of lines and spaces that were etched in an uncross-linked silylated resist and FIG. 4 is a photograph of lines and trenches that were etched in a cross-linked, silylated resist. The caps on the lines in FIG. 4 illustrate the effects of the cross-linker in confining the silylated region over the lines. There are no such caps over the lines in FIG. 3, indicating that the silylated region was not confined as it was in the resist in the FIG. 4 photograph.

Figure 6:
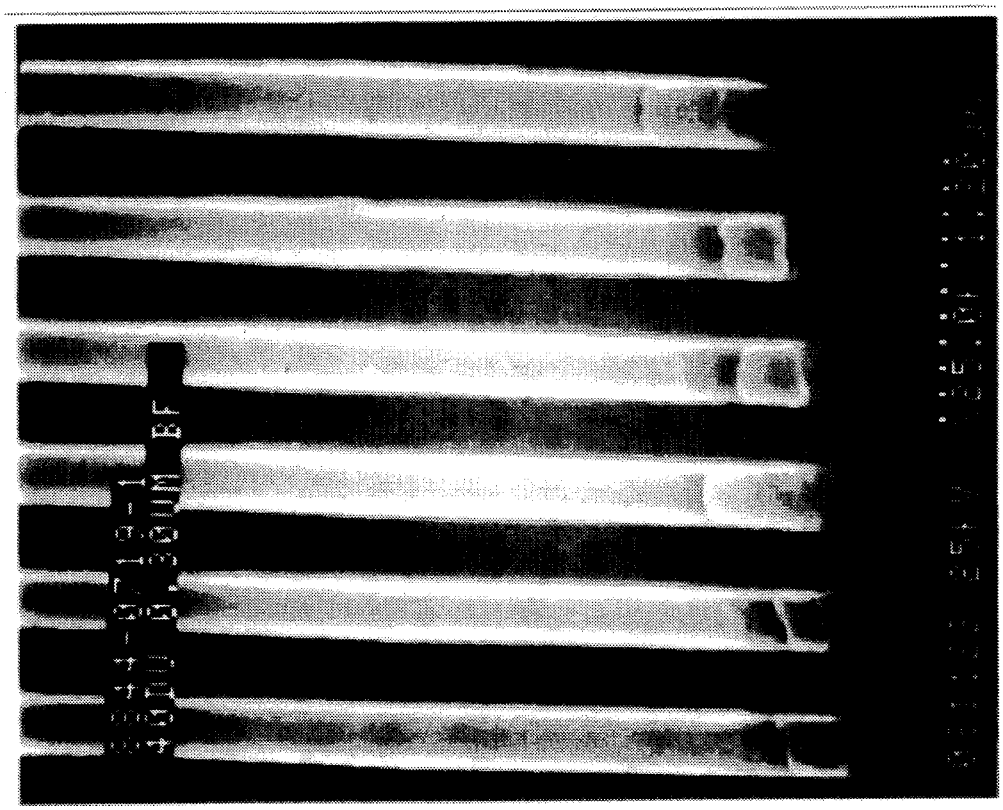
FIG. 6 is a photograph of a resist that was silylated with a cross-linker.
Figure 5:
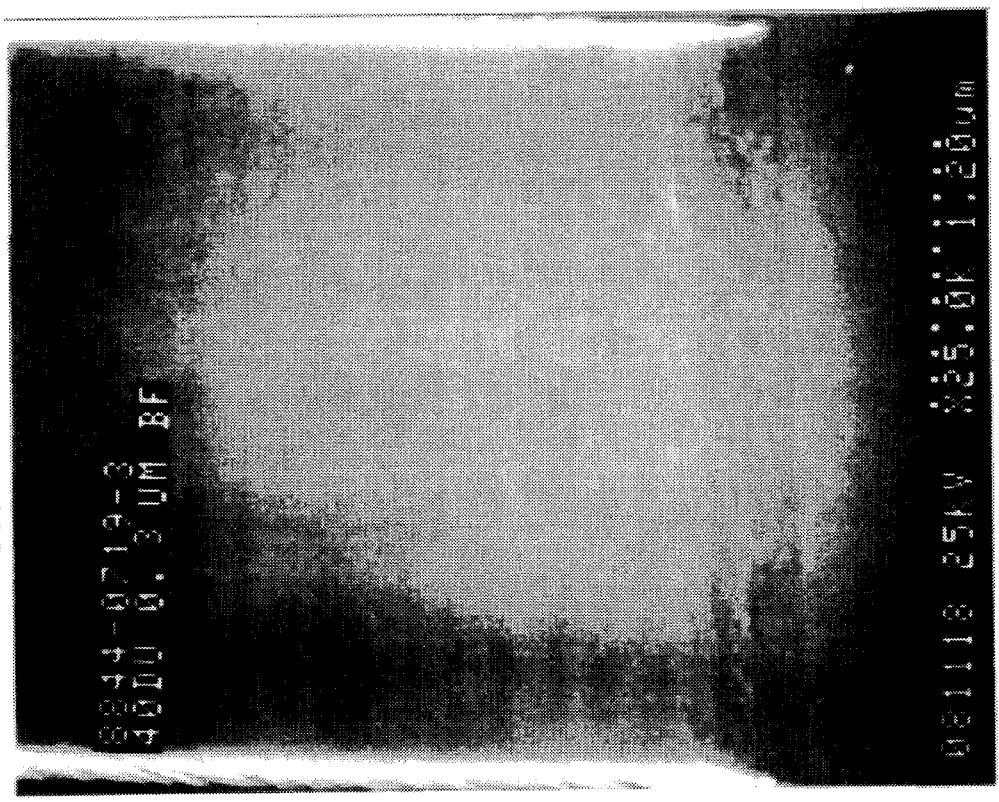
FIG. 5 is a photograph of a resist that was silylated without a crosslinker.

FIGS. 5 and 6 illustrates that the cross-linker confines the silylated regions. FIG. 5 is a top view of a silylated resist. Note that there is little differentiation between the unsilylated and silylated regions. FIG. 6 is a top view of a resist that was silylated using a cross-linker. There is obvious differentiation between the silylated regions 10 and the unsilylated regions 20, indicating that the cross-linker acts to confine the silylated regions.

We claim:

1. A process for manufacturing a device comprising: depositing an imaging layer comprising a polymeric resist material on a substrate; exposing a portion of the imaging layer to radiation, thereby forming an exposed region and an unexposed region that together define an image of a pattern in the imaging layer; introducing into the imaging layer a refractory material comprising a silylating reagent that is selectively permeable into one of either the exposed region or the unexposed region of the imaging layer, in combination with about 0.5 volume percent to about 25 volume percent of a silicon-containing cross-linking reagent characterized by the formula:

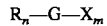

wherein m is greater than or equal to 2, n is greater than or equal to zero, m is at least 2, X is a reactive group that reacts with a functional group pendant to the polymeric resist material, the reaction causing the remaining portion of the cross-linking reagent, $R_nG$ to bind to the polymeric resist material, G is a connecting moiety, and R groups are all selected from the group consisting of H and alkyl, wherein the R groups are the same or different, and developing the pattern in the imaging layer.

2. The process of claim 1 wherein the cross-linking reagent is characterized by the general formula:

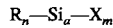

wherein a is greater than or equal to 1, n is less than or equal to 2a and m is greater than or equal to 2.

3. The process of claim 1 further comprising depositing a planarizing layer onto the substrate prior to depositing the imaging layer thereon.

4. The process according to claim 1 wherein the polymeric resist material in the exposed region has pendant functional groups that are susceptible to reaction in significant amounts with the X group.

5. The process according to claim 1 wherein the polymeric resist material in the unexposed region has pendant functional groups that are susceptible to reaction in significant amounts with the X group.

6. The process according to claim 2 wherein X is selected from the group consisting of N,N-dimethylamino, N-methylamino, N,N-diethylamino, N-ethylamino, azido, fluoro, chloro, bromo, iodo, cyano and thiocyano.

7. The process of claim 2 wherein the alkyl groups are selected from the group consisting of ethyl and methyl.

8. The process of claim 7 wherein the alkyl groups are methyl groups.

9. The process of claim 2 wherein the image is developed by oxygen plasma etching in a plasma that comprises an oxygen species.

10. The process of claim 3 wherein the planarizing layer so deposited absorbs radiation of the same wavelength as the wavelength of the radiation to which a portion of the imaging layer is exposed.

11. The process of claim 3 wherein the planarizing layer so deposited is not substantially permeable by the silylating reagent.

12. The process of claim 2 wherein the radiation which is used to expose the imaging layer has a wavelength in the ultraviolet range.

13. The process of claim 2 wherein the radiation which is used to expose the imaging layer has a wavelength in the x-ray range.

14. The process of claim 2 wherein the cross-linking reagent is selected from the group consisting of 1,2- bis-(N, N-dimethylamino)tetramethyldisilane, bis -(N,N-dimethylamino)methylsilane, and bis-(N,N-dimethylamino)dimethylsilane.

15. The process of claim 13 wherein the refractory material is combined with about 0.5 to about 10 volume percent cross-linking reagent.

16. A process for manufacturing a device comprising: obtaining a substrate; depositing a planarizing layer comprising a polymeric resist material substrate; depositing an imaging layer comprising a polymeric resist material with pendant functional groups on the planarizing layer; exposing a portion of the imaging layer to radiation, thereby forming an exposed region and an unexposed region that together define an image of a pattern in the imaging layer; introducing into the imaging layer a refractory material comprising an organodisilane that is selectively permeable into one of either the exposed region or the unexposed region of the imaging layer, the refractory material characterized by the formula:

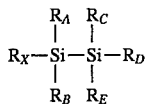

wherein $R_x$ is a reactive group that selectively reacts with the functional groups pendant to the polymeric resist material in one of either the exposed region or the unexposed region of the imaging layer, the reaction producing a reactive site with which the remaining portion of the refractory material, $SiR_A R_B SiR_C R_D R_E$, reacts, and groups $R_{(A-E)}$ are all selected from the group consisting of H and $CH_3$ wherein $R_{(A-E)}$ are the same or different and wherein at least two of $R_{(A-E)}$ are $CH_3$ and wherein the refractory material is combined with a cross-linker having the general formula

wherein a is greater than or equal to 1, n is less than or equal to 2a and m is greater than or equal to 2, X is a reactive group that reacts with functional groups pendant to the polymeric resist material and R is selected from the group consisting of H and alkyl, and wherein the cross-linker cross-links at least some of the polymeric resist material; and developing the pattern in the imaging layer.

17. The process according to claim 16 wherein the polymeric resist material in the exposed region has pendant functional groups that are susceptible to reaction in significant amounts with the organodisilane.

18. The process according to claim 16 wherein the polymeric resist material in the unexposed region has pendant functional groups that are susceptible to reaction in significant amounts with the organodisilane.

19. The process according to claim 16 wherein $R_x$ and X are both selected from the group consisting of N,N-dimethylamino, N-methylamino, N,N-diethylamino, N-ethylamino, azido, fluoro, chloro, bromo, iodo, cyano, and thiocyano and wherein $R_x$ and X are the same or different but, if different, do not react significantly with each other.

20. The process of claim 16 wherein the image is developed by etching in a plasma that comprises an oxygen species.

21. The process of claim 16 wherein the refractory material is combined with about 0.25 to about 25 percent by volume cross-linking reagent.

22. The process of claim 21 wherein the cross-linking reagent is selected from the group consisting of 1,2- bis-(N,N-dimethylamino)tetramethyldisilane, bis -(N,N-dimethylamino)methylsilane and bis-(N,N-dimethylamino)dimethylsilane.

* * * * *